(12) United States Patent
Otsuka

(10) Patent No.: US 6,463,562 B1
(45) Date of Patent: Oct. 8, 2002

(54) SEMICONDUCTOR DEVICE INCLUDING MACROS AND ITS TESTING METHOD

(75) Inventor: Shigekazu Otsuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/585,836

(22) Filed: Jun. 1, 2000

(30) Foreign Application Priority Data

Apr. 6, 1999 (JP) ............................................ 11-158749

(51) Int. Cl.$^7$ ................................................ G01R 31/28
(52) U.S. Cl. ........................................ 714/742; 714/736
(58) Field of Search ................................ 714/736, 737, 714/724; 324/73, 16, 487, 492

(56) References Cited

U.S. PATENT DOCUMENTS

| | | | |
|---|---|---|---|
| 4,027,289 A | | 5/1977 | Toman |
| 4,418,397 A | * | 11/1983 | Brantingham et al. ....... 708/100 |
| 4,470,116 A | | 9/1984 | Ratchford |
| 4,525,789 A | * | 7/1985 | Kemper et al. .............. 702/117 |
| 4,535,789 A | * | 8/1985 | Irving et al. ................. 131/280 |
| 4,970,648 A | | 11/1990 | Capots |
| 5,289,377 A | | 2/1994 | Yokote et al. |
| 5,515,517 A | * | 5/1996 | Nozuyama et al. .......... 710/129 |
| 6,330,977 B1 | * | 12/2001 | Hass et al. ................... 235/487 |

FOREIGN PATENT DOCUMENTS

| | | | |
|---|---|---|---|
| EP | 0 333 241 A | 9/1989 | ............ G01R/31/28 |
| EP | 0454052 A | 10/1991 | ............ G06F/11/26 |
| JP | H02-95876 | 7/1990 | ......... G01R/31/318 |
| JP | H05-288807 | 11/1993 | ............ G01R/31/28 |
| JP | H06-109816 | 4/1994 | ............ G01R/31/28 |
| JP | H08-043494 | 2/1996 | ............ G01R/31/28 |
| JP | H09-211076 | 8/1997 | ............ G01R/31/28 |

OTHER PUBLICATIONS

Cia et al: Digital Serial Communication Device Testing and its ilplications on Automatic Test Equipment Architecture, IEEE 2000.*
Dallas Semiconductor, Data Sheet: DS1820 1–Wire Digital Thermometer, Mar. 5, 1998, pp. 9–19, Dallas Semiconductor Corp., Dallas, TX.

* cited by examiner

Primary Examiner—Albert Decady
Assistant Examiner—Emeka J. Amanze
(74) Attorney, Agent, or Firm—Scully, Scott, Murphy & Presser

(57) ABSTRACT

A semiconductor device includes a common bus and a plurality of macros connected in series by connections. Each of the macros is constructed by an internal circuit, a buffer connected between an input of the internal circuit and the common bus, a register connected to the common bus, and a logic circuit for selecting one of an output signal of the internal circuit and an output signal of the register.

9 Claims, 9 Drawing Sheets

SEMICONDUCTOR DEVICE INCLUDING MACROS AND ITS TESTING METHOD

BACKGROUND OF THE INVENTION

1. Field of the Invention

The present invention relates to a semiconductor device such as a one-chip microcomputer including a plurality of circuit blocks (macros) and a method for testing the semiconductor device.

2. Description of the Related Art

In a prior art one-chip microcomputer, macros are connected in series by connections between input terminals and output terminals. In order to test the connections, a boundary scan path is provided. Note that the boundary scan path is also used for testing the functions of the macros. This will be explained later in detail.

In the above-described prior art one-chip microcomputer, however, when the number of macros as well as the number of connections thereof is increased, an area for the hardware of the boundary scan path is required. Thus, the integration would be reduced. Further, it is impossible to completely test the connections.

SUMMARY OF THE INVENTION

It is an object of the present invention to provide a semiconductor device including a plurality of macros capable of enhancing the integration and enabling complete testing of the connections of the macros.

Another object is to provide a method for testing such a semiconductor device.

According to the present invention, a semiconductor device includes a common bus and a plurality of macros connected in series by connections. Each of the macros is constructed by an internal circuit, a buffer connected between an input of the internal circuit and the common bus, a register connected to the common bus, and a logic circuit for selecting one of an output signal of the internal circuit and an output signal of the register.

BRIEF DESCRIPTION OF THE DRAWINGS

The present invention will be more clearly understood front the description set forth below, as compared with the prior art, with reference to the accompanying drawings, wherein.

DESCRIPTION OF THE PREFERRED EMBODIMENTS

Before the description of the preferred embodiments, a prior art one-chip microcomputer will be explained with reference to FIG. 1.

Figure 1:
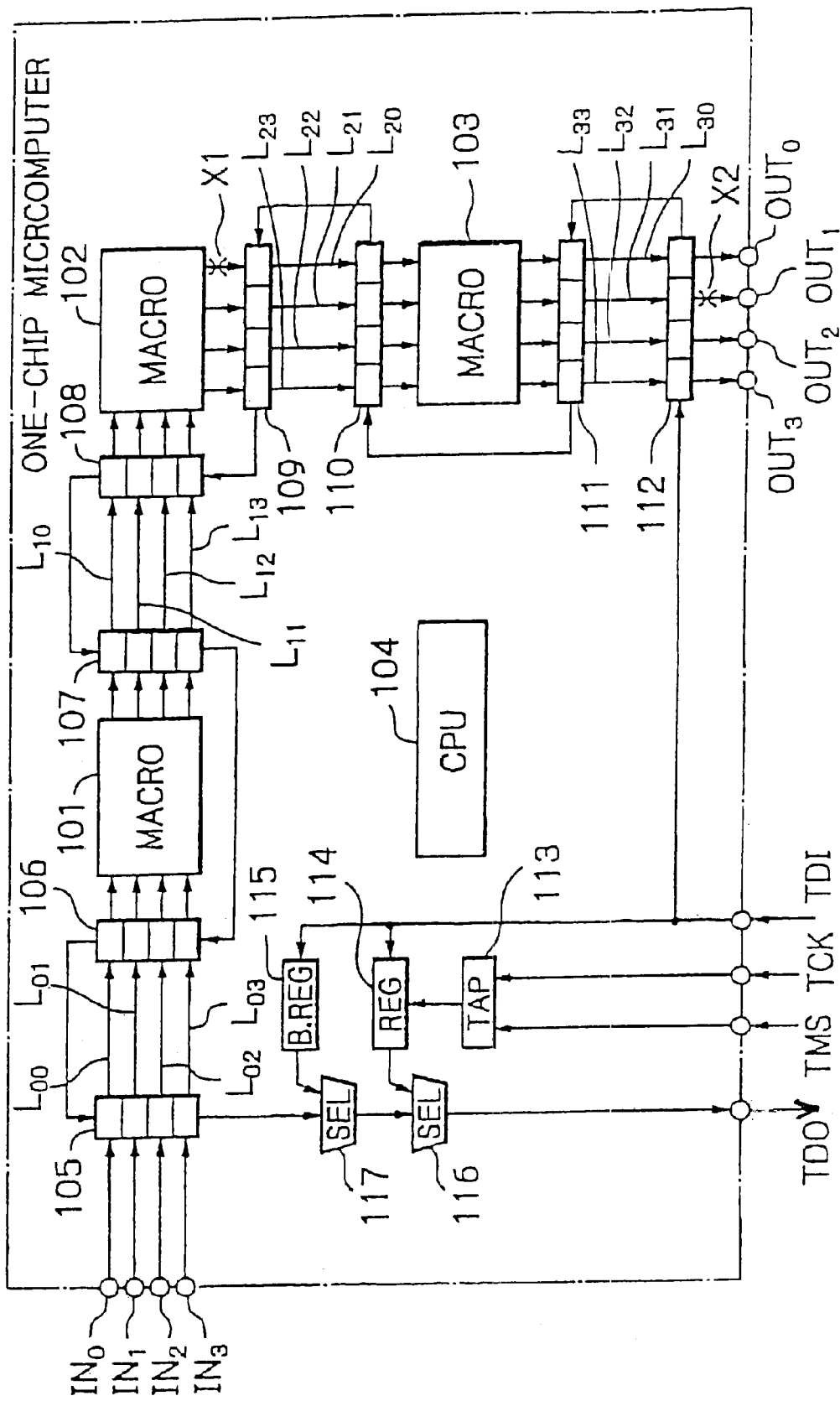
FIG. 1 is a block circuit diagram illustrating a prior art one-chip microcomputer.

In FIG. 1, macros 101, 102 and 103 are connected in series between input terminals $IN_0$, $IN_1$, $IN_2$ and $IN_3$, and output terminals $OUT_0$, $OUT_1$, $OUT_2$ and $OUT_3$. The macros 101, 102 and 103 are controlled by a central processing unit (CPU) 104.

In order to test connections $L_{00}$ through $L_{03}$ between the input terminals $IN_0$, $IN_1$, $IN_2$, and $IN_3$, and the macro 101, connections $L_{10}$ through $L_{13}$, between the macros 101 and 102, connections $L_{20}$, through $L_{23}$ between the macros 102 and 103, and connections $L_{30}$, through $L_{33}$ between the output terminals $OUT_0$, $OUT_1$, $OUT_2$, and $OUT_3$, a boundary scan path is provided. Note that the boundary scan path is also used for testing the functions for the macros 101, 102, and 103.

The boundary scan path is constructed by a four-bit shift register 105 connected in proximity to the input terminals $IN_0$, $IN_1$, $IN_2$ and $IN_3$, a four-bit shift register 106 connected in proximity to the inputs of the macro 101, a four-bit shift register 107 connected in proximity to the outputs of the macro 101, a four-bit shift register 108 connected in proximity to the inputs of the macro 102, a four-bit shift register 109 connected in proximity to the outputs of the macro 102, a four-bit shift register 110 connected in proximity to the inputs of the macro 103, a four-bit shift register 111 connected in proximity to the outputs of the macro 103, and a four-bit shift register 112 connected in proximity to the output terminals $OUT_0$, $OUT_1$, $OUT_2$ and $OUT_3$. The shift registers 112, 111, 110, 109, 108, 107, 106 and 105 are connected in cascade between a data input terminal TDI and a data output terminal TDO.

Additionally, in order to control the boundary scan path, a test access port (TAP) control circuit 113 connected to a clock terminal TCK and a macro selection terminal TMS, an instruction register 114 connected to the input data terminal TDI, a bypass register 115 connected to the input data terminal TDI, a selector 116 for selecting one of the boundary scan path and the instruction register 114, and a selector 117 for selecting one of the boundary scan path and the bypass register 115.

In a normal mode, all the shift registers 105 through 112 are put into a through state by the CPU 104. As a result, the shift registers 105 through 112 do not affect the operation of the macros 101, 102 and 103.

In a test mode for testing the connections $L_{00}$, $L_{01}$, ..., $L_{33}$, after all the shift registers 105 through 112 are cleared, (1, 1, 1, 1) is set in each of the shift registers 105, 107, 109 and 111. Then, the data of the shift registers 105, 107, 109 and 111 are written into the shift registers 106, 108, 110 and 112 through the connections $L_{00}$, $L_{01}$, ..., $L_{33}$. Finally, all the shift registers 105 through 112 are connected in cascade, so that the data of all the shift registers 105 through 112 are read out of the data output terminal TDO. Thus, the read data is compared with predetermined data which is in this case (1, 1, ..., 1), to determine whether the connections $L_{00}$, $L_{01}$, ..., $L_{33}$ are connected or disconnected.

In the one-chip microcomputer of FIG. 1, however, when the number of macros as well as the number of connections thereof is increased, shift registers are increased in number and in size. Also, an area for the boundary scan path is required. Thus, the integration would be reduced. Further, it is impossible to test the connections between the macro such as 102 and the shift register such as 109 as indicated by X1 in FIG. 1 and the connections between the shift register such as 112 and the terminals such as $OUT_0$, $OUT_1$, $OUT_2$ and $OUT_3$ as indicated by X2 in FIG. 1.

Figure 2:
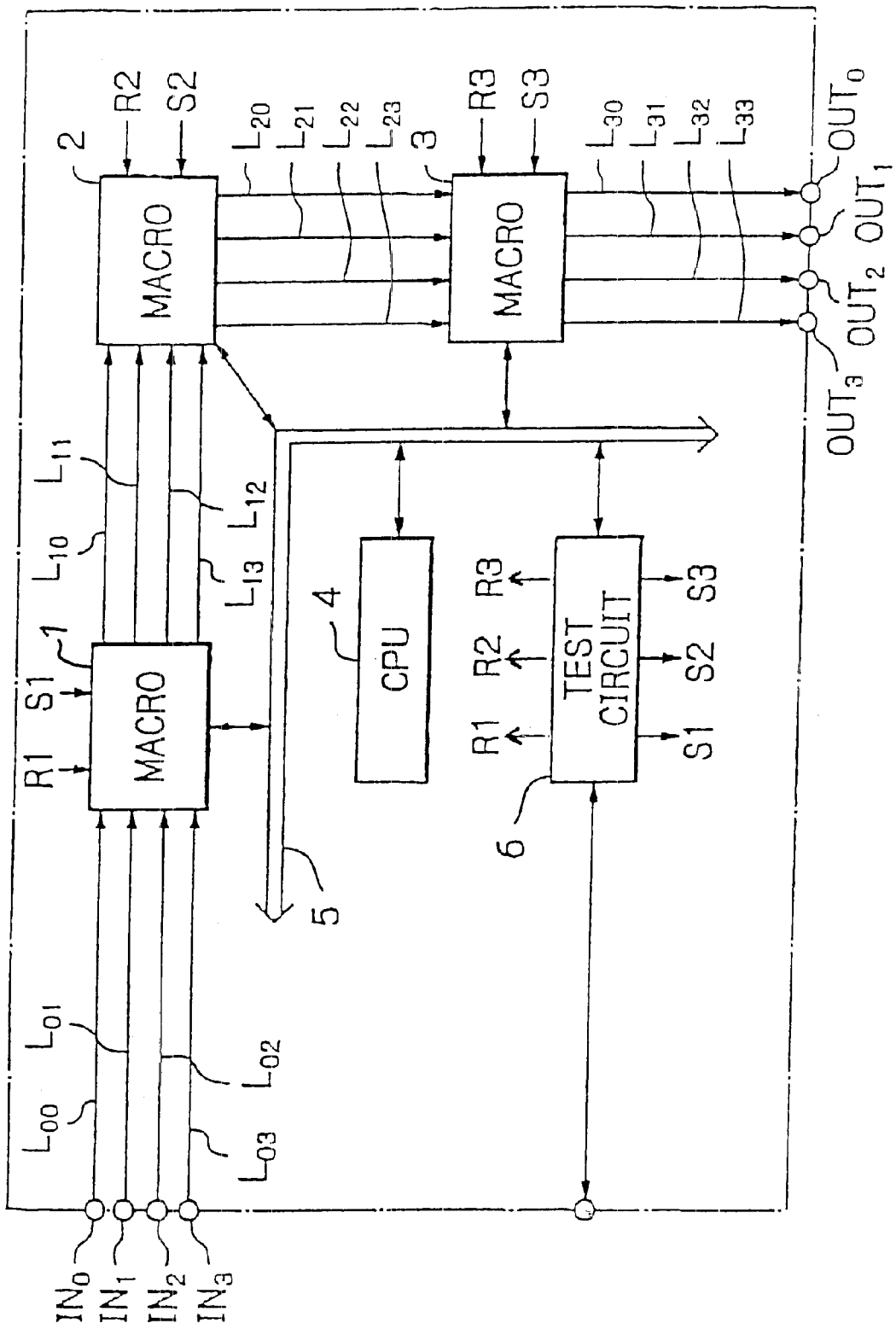
FIG. 2 is a block circuit diagram illustrating a first embodiment of the one-chip microcomputer according to the present invention.

In FIG. 2, which illustrates a first embodiment of the present invention, macros 1, 2 and 3 are connected in series between input terminals $IN_0$, $IN_1$, $IN_2$ and $IN_3$, and output terminals $OUT_0$, $OUT_1$, $OUT_2$, and $OUT_3$. The macros 1, 2 and 3 are controlled by a CPU 4 via a common bus 5.

In order to test connections $L_{00}$ through $L_{03}$ between the input terminals $IN_0$, $IN_1$, $IN_2$ and $IN_3$, and the macro 1, connections $L_{10}$ through $L_{13}$ between the micros 1 and 2, connections $L_{20}$ through $L_{23}$ between the micros 2 and 3, and connections $L_{30}$ through $L_{33}$ between the output terminals $OUT_0$, $OUT_1$, $OUT_2$ and $OUT_3$, a test circuit 6 is connected to the common bus 5. Note that the test circuit 6 is also used for testing the functions of the macros 1, 2 and 3.

Thus, the test circuit 6 can test the macros 1, 2 and 3 without the CPU 4.

Note that the test circuit 6 generates reset signals R1, R2 and R3 and transmits them to the macros 1, 2 and 3, respectively, and generates selection signals S1, S2 and S3 and transmits them to the macros 1, 2 and 3, respectively.

Figure 3:
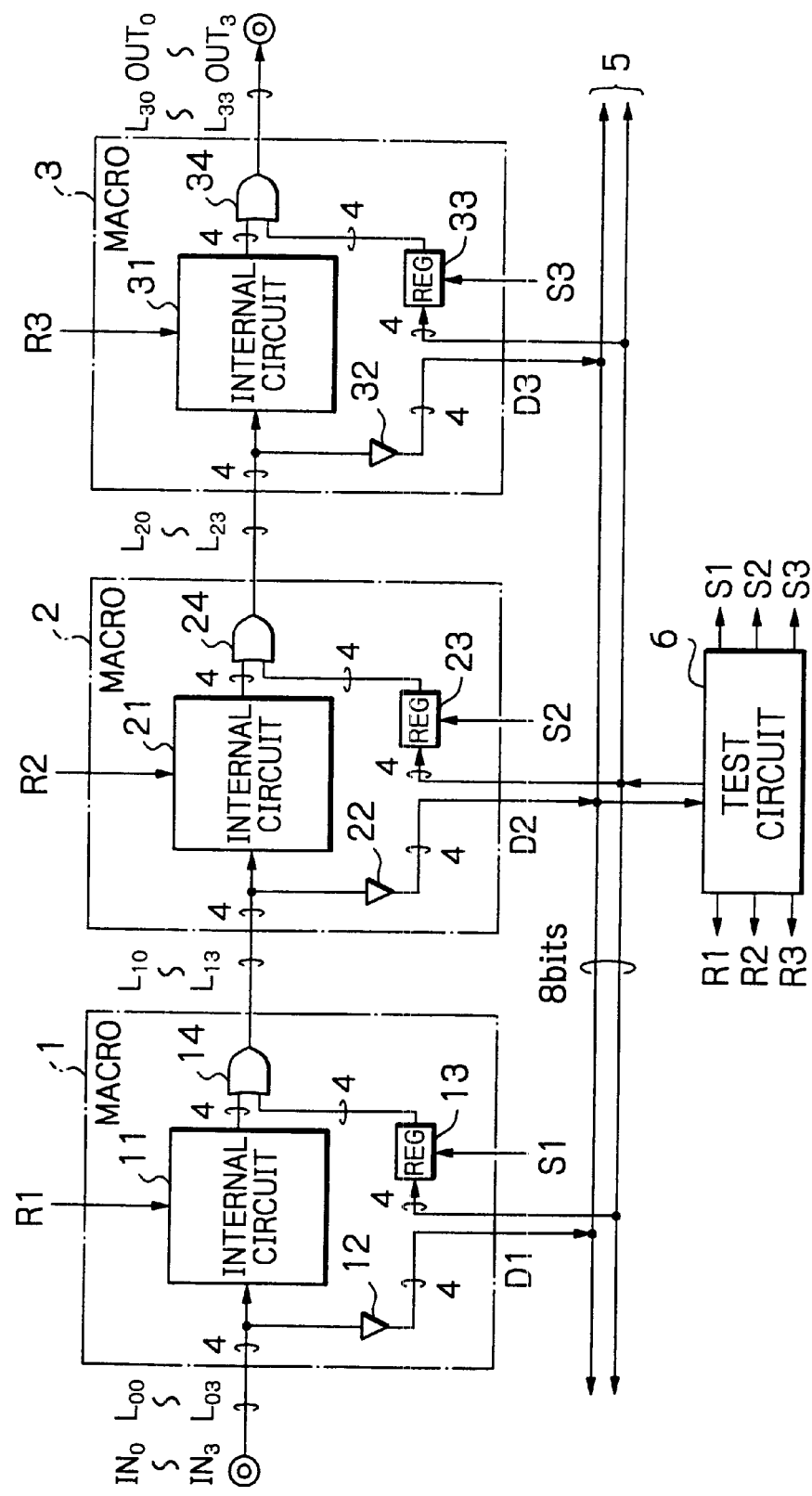
FIG. 3 is a detailed circuit diagram of the macros of FIG. 3.

In FIG. 3, which is a detailed circuit diagram of the macros 1, 2 and 3 of FIG. 2, the macro 1 is constructed by an internal circuit 11 corresponding to the macro 101 of FIG. 1 connected to the connections $L_{00}$, $L_{01}$, $L_{02}$ and $L_{03}$, a buffer 12 connected between the connections $L_{00}$, $L_{01}$, $L_{02}$ and $L_{03}$ and the common bus 5, a register 13 connected to the common bus 5, and an OR circuit 14 connected to the internal circuit 11, the register 13 and the connections $L_{10}$, $L_{11}$, $L_{12}$ and $L_{13}$. The internal circuit 11 is reset by the reset signal R1 from the test circuit 6, while the register 13 is selected by the selection signal S1 from the test circuit 6.

Also, the macro 2 is constructed by an internal circuit 21 corresponding to the macro 102 of FIG. 1 connected to the connections $L_{10}$, $L_{11}$, $L_{12}$ $L_{13}$, a buffer 22 connected between the connections $L_{10}$, $L_{11}$, $L_{12}$ and $L_{13}$ and the common bus 5, a register 23 connected to the common bus 5, and an OR circuit 24 connected to the internal circuit 21, the register 23 and the connections $L_{20}$, $L_{21}$, $L_{22}$ and $L_{23}$. The internal circuit 21 is reset by the reset signal R2 from the test circuit 6, while the register 23 is selected by the selection signal S2 from the test circuit 6.

Further, the macro 3 is constructed by an internal circuit 31 corresponding to the macro 103 of FIG. 1 connected to the connections $L_{20}$, $L_{21}$, $L_{22}$ and $L_{23}$, a buffer 32 connected between the connections $L_{20}$, $L_{21}$, $L_{22}$ and $L_{23}$ and the common bus 5, a register 33 connected to the common bus 5, and an OR circuit 34 connected to the internal circuit 31, the register 33 and the connections $L_{30}$, $L_{31}$, $L_{32}$ and $L_{33}$. The internal circuit 31 is reset by the reset signal R3 from the test circuit 6, while the register 33 is selected by the selection signal S3 from the test circuit 6.

The operation of the test circuit 6 of FIG. 3 is explained with reference to FIGS. 4A, 4B and 4C. Note that the test circuit 6 is also constructed by a microcomputer or the like to carry out programs as illustrated in FIGS. 4A, 4B and 4C.

Figure 4A:
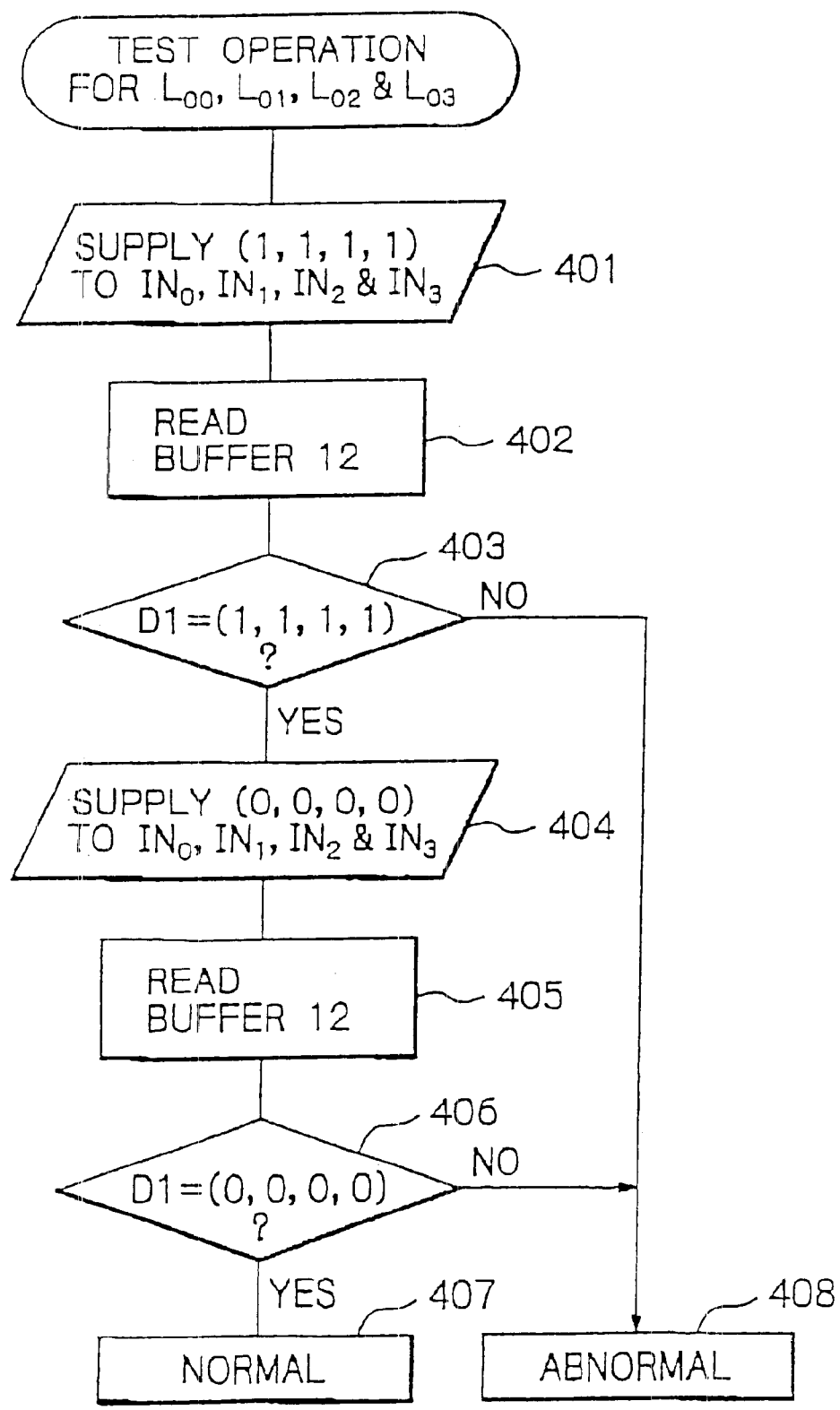
FIGS. 4A, 4B and 4C are flowcharts showing the operation of the test circuit of FIG. 3.
Figure 4B:
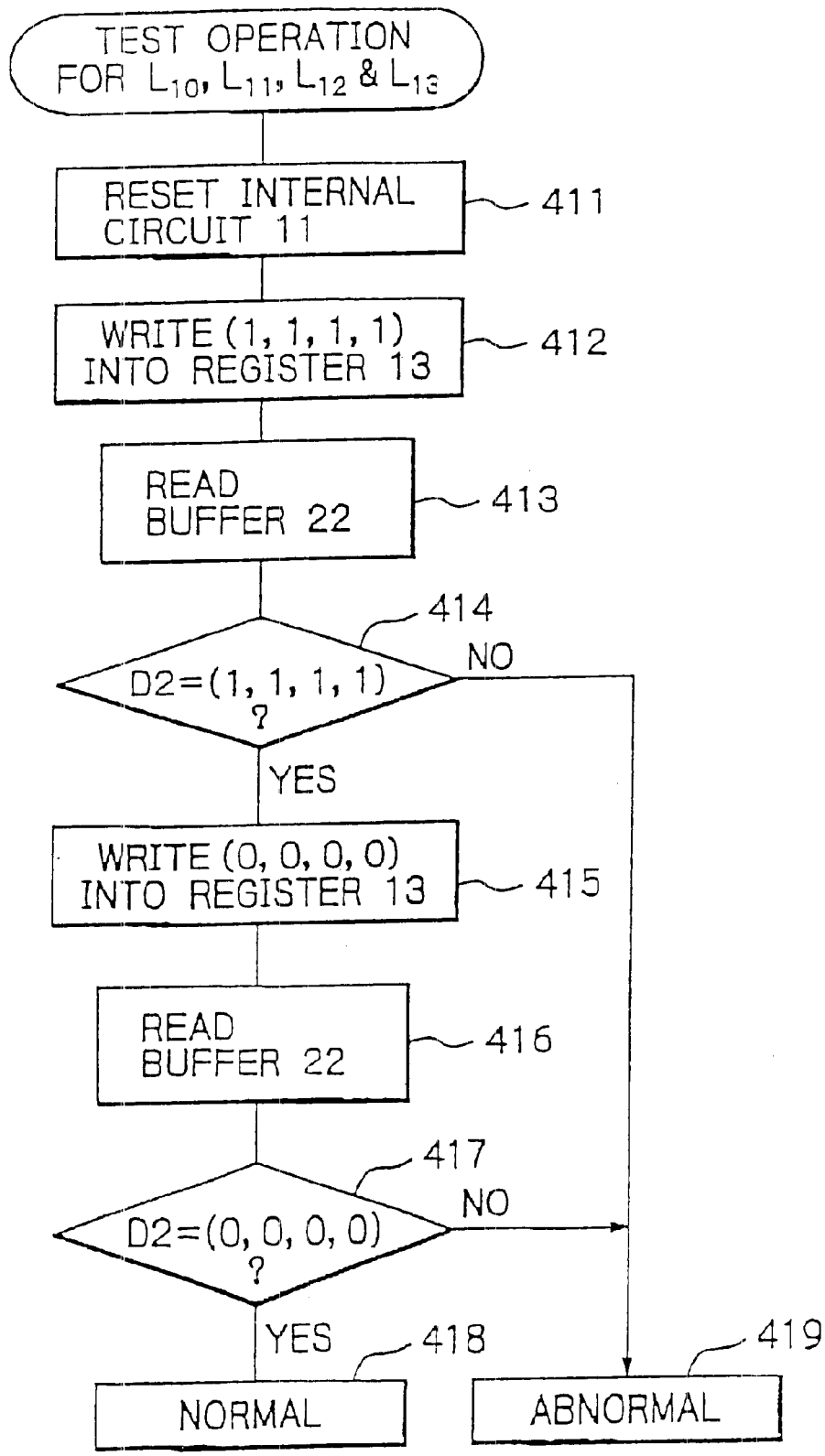
Figure 4C:
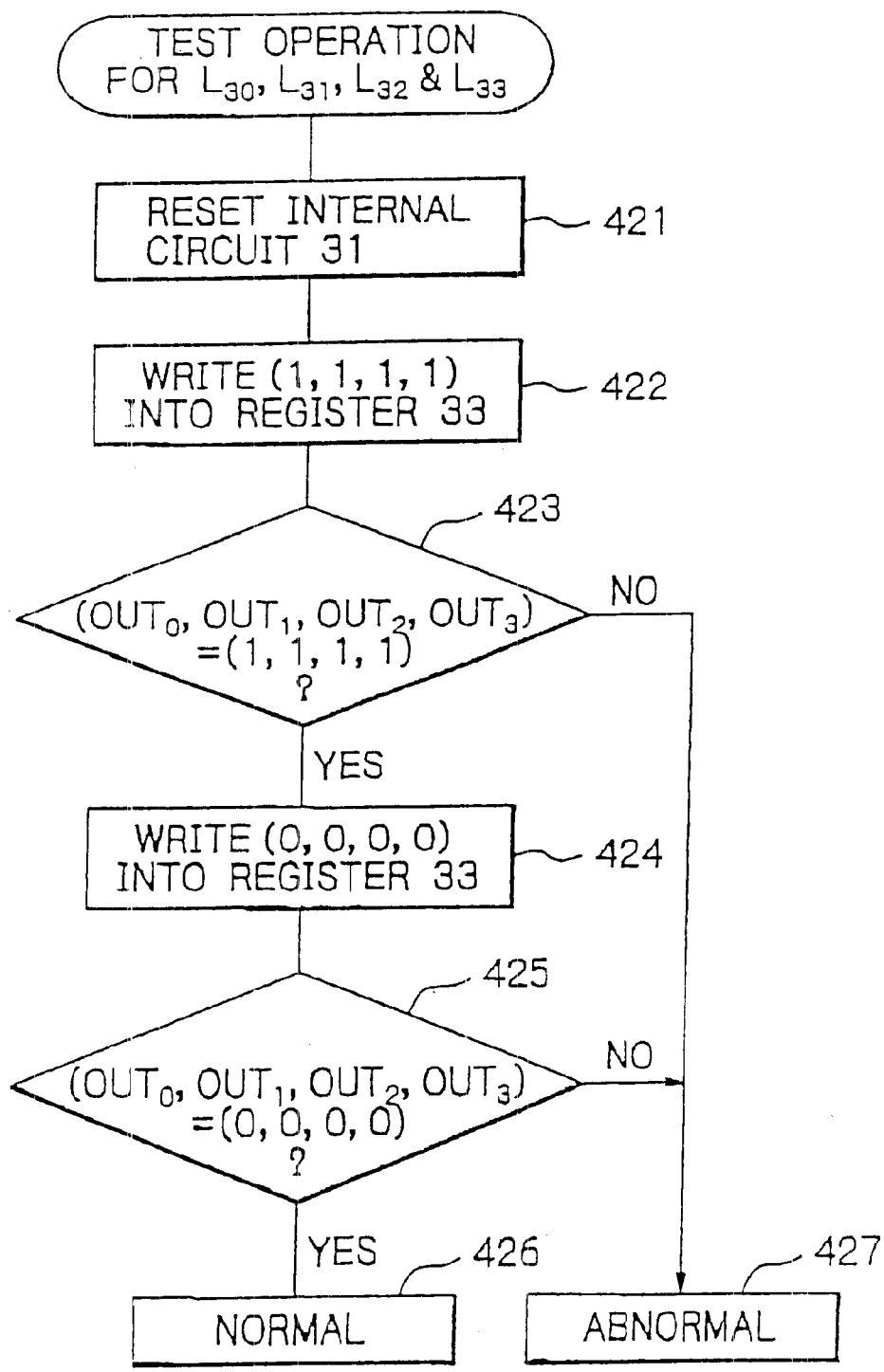

FIG. 4A is a flowchart for testing the connections $L_{00}$, $L_{01}$, $L_{02}$ and $L_{03}$ of FIG. 3.

First, referring to step 401, data (1, 1, 1, 1) is supplied from the exterior to the input terminals $IN_0$, $IN_1$, $IN_2$ and $IN_3$.

Next, referring to step 402, data D1 is read from the buffer 12 via the common bus 5.

Next, referring to step 403, it is determined whether the data D1 coincides with (1, 1, 1, 1). As a result, if D1=(1, 1, 1, 1), the control proceeds to step 404. Otherwise, the control proceeds directly to step 408 which determines that some of the connections $L_{00}$, $L_{01}$, $L_{02}$ and $L_{03}$ are abnormal, i.e., disconnected.

On the other hand, referring to step 404, data (0, 0, 0, 0) is supplied from the exterior to the input terminals $IN_0$, $IN_1$, $IN_2$ and $IN_3$.

Next, referring to step 405, data D1 is read from the buffer 12 via the common bus 5.

Next, referring to step 406, it is determined whether the data D1 coincides with (0, 0, 0, 0). As a result, if D1=(0, 0, 0, 0), the control proceeds to step 407 which determines that the connections $L_{00}$, $L_{01}$, $L_{02}$ and $L0_{03}$ are normal. Otherwise, the control proceeds to step 408 which determines that some of the connections $L_{00}$, $L_{01}$, $L_{02}$ and $L_{03}$ are abnormal, i.e., disconnected.

Thus, the testing operation of the connections $L_{00}$, $L_{01}$, $L_{02}$ and $L_{03}$ is completed.

FIG. 4B is a flowchart for testing the connections $L_{10}$, $L_{11}$, $L_{12}$ and $L_{13}$ of FIG. 3.

First, referring to step 411, the test circuit 6 generates a reset signal R1 to reset the internal circuit 11. In this case, the output of the internal circuit 11 becomes "0".

Next, referring to step 412, the test circuit 6 generates a selection signal S1 to select the register 13, and writes data (1, 1, 1, 1) in the register 13.

Next, referring to step 413, data D2 is read from the buffer 22 via the common bus 5.

Next, referring to step 414, it is determined whether the data D2 coincides with (1, 1, 1, 1). As a result, if D2=(1, 1, 1, 1), the control proceeds to step 415. Otherwise, the control proceeds directly to step 419 which determines that some of the connections $L_{10}$, $L_{11}$, $L_{12}$ and $L_{13}$ are abnormal, i.e., disconnected.

On the other hand, referring to step 416, the test circuit 6 again generates a selection signal S1 to select the register 13, and writes data (0, 0, 0, 0) in the register 13.

Next, referring to step 416, data D2 is read from the buffer 22 via the common bus 5.

Next, referring to step 417, it is determined whether the data D2 coincides with (0, 0, 0, 0). As a result, if D2=(0, 0, 0, 0), the control proceeds to step 418 which determines that the connections $L_{10}$, $L_{11}$, $L_{12}$ and $L_{13}$ are normal. Otherwise, the control proceeds to step 419 which determines that some of the connections $L_{10}$, $L_{11}$, $L_{12}$ and $L_{13}$ are abnormal, i.e., disconnected.

Thus, the test operation of the connections $L_{10}$, $L_{11}$, $L_{12}$ and $L_{13}$ is completed.

Note that the connections $L_{20}$, $L_{21}$, $L_{22}$ and $L_{23}$ can be tested in the same way as the connections $L_{10}$, $L_{11}$, $L_{12}$ and $L_{13}$ as illustrated in FIG. 4B.

FIG. 4C is a flowchart for testing the connections $L_{30}$, $L_{31}$, $L_{32}$ and $L_{33}$ of FIG. 3.

First, referring to step 421, the test circuit 6 generates a reset signal R3 to reset the internal circuit 31. In this case, the output of the internal circuit 31 becomes "0".

Next, referring to step 422, the test circuit 6 generates a selection signal S3 to select the register 33, and writes data (1, 1, 1, 1) in the register 33.

Next, referring to step 423, data at the output terminals $OUT_0$, $OUT_1$, $OUT_2$, and $OUT_3$ are read from the exterior. Then, it is determined whether the data at the output terminals $OUT_0$, $OUT_1$, $OUT_2$ and $OUT_3$, coincides with (1, 1, 1, 1). As a result, if $(OUT_0, OUT_1, OUT_2, OUT_3)$=(1, 1, 1, 1), the control proceeds to step 424. Otherwise, the control proceeds directly to step 427 which determines that some of the connections $L_{10}$, $L_{11}$, $L_{12}$ and $L_{13}$ are abnormal, i.e., disconnected.

On the other hand, referring to step 424, the test circuit 6 generates a selection signal S3 to select the register 33, and writes data (0, 0, 0, 0) in the register 33.

Next, referring to step 425, data at the output terminals $OUT_0$, $OUT_1$, $OUT_2$ and $OUT_3$ are read from the exterior. Then, it is determined whether the data at the output terminals $OUT_0$, $OUT_1$, $OUT_2$ and $OUT_3$ coincides with (0, 0, 0, 0). As a result, if $(OUT_0, OUT_1, OUT_2, OUT_3)=(0, 0, 0, 0)$, the control proceeds to step 426 which determines that the connections $L_{30}$, $L_{31}$, $L_{32}$ and $L_{33}$ are normal. Otherwise, the control proceeds directly to step 427 which determines that some of the connections $L_{10}$, $L_{11}$, $L_{12}$ and $L_{,13}$ are abnormal, i.e., disconnected.

Thus, the test operation of the connections $L_{30}$, $L_{31}$, $L_{32}$ and $L_{33}$ is completed.

Figure 5:
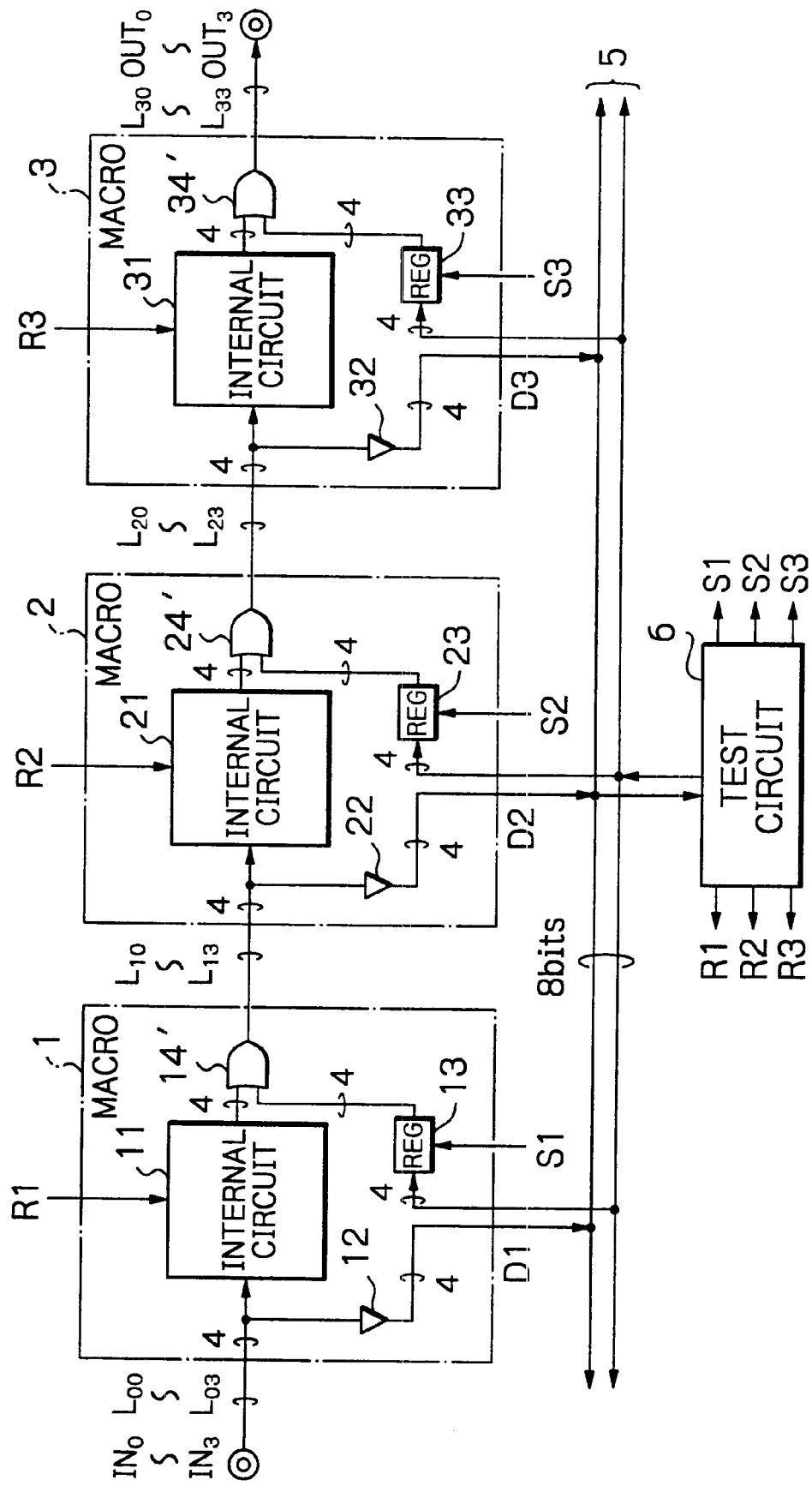
FIG. 5 is a block circuit diagram illustrating a modification of the circuit of FIG. 2.

In FIG. 5, which illustrates a modification of the macros 1, 2 and 3 of FIG. 3, AND circuits 14', 24' and 34' are provided instead of the OR circuits 14, 24 and 34 of FIG. 3. In this case, when the internal circuits 11, 21 and 31 are reset by the reset signals R1, R2 and R3 of the test circuit 6, the outputs of the internal circuits 11, 21 and 31 become "1". Even in FIG. 5, the test circuit 6 operates in the same way as illustrated in FIGS. 4A, 4B and 4C.

Figure 6:
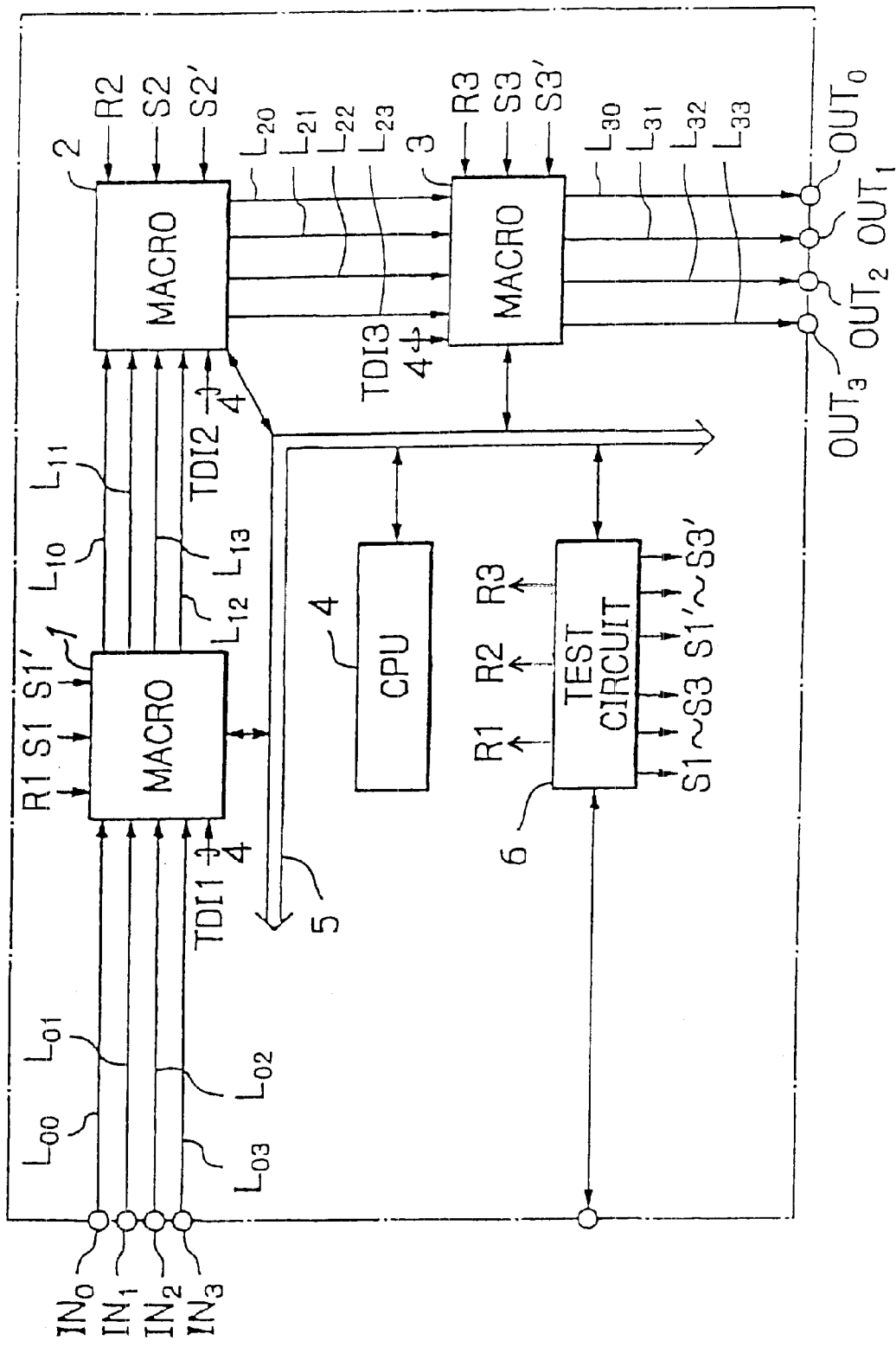
FIG. 6 is a block circuit diagram illustrating a second embodiment of the one-chip microcomputer according to the present invention.

In FIG. 6, which illustrates a second embodiment of the present invention, 4-bit input test data TDI1 is supplied by the test circuit 6 to the internal circuit 11 of the macro 1 of FIGS. 2 and 3, 4-bit input test data TDI2 is supplied by the test circuit 6 to the internal circuit 21 of the macro 2 of FIGS. 2 and 3, and 4-bit input test data TDI3 is supplied by the test circuit 6 to the internal circuit 31 of the macro 3 of FIGS. 2 and 3. Also, selection signals S1', S2' and S3' are supplied by the test circuit 6 to the macros 1, 2 and 3, respectively.

Figure 7:
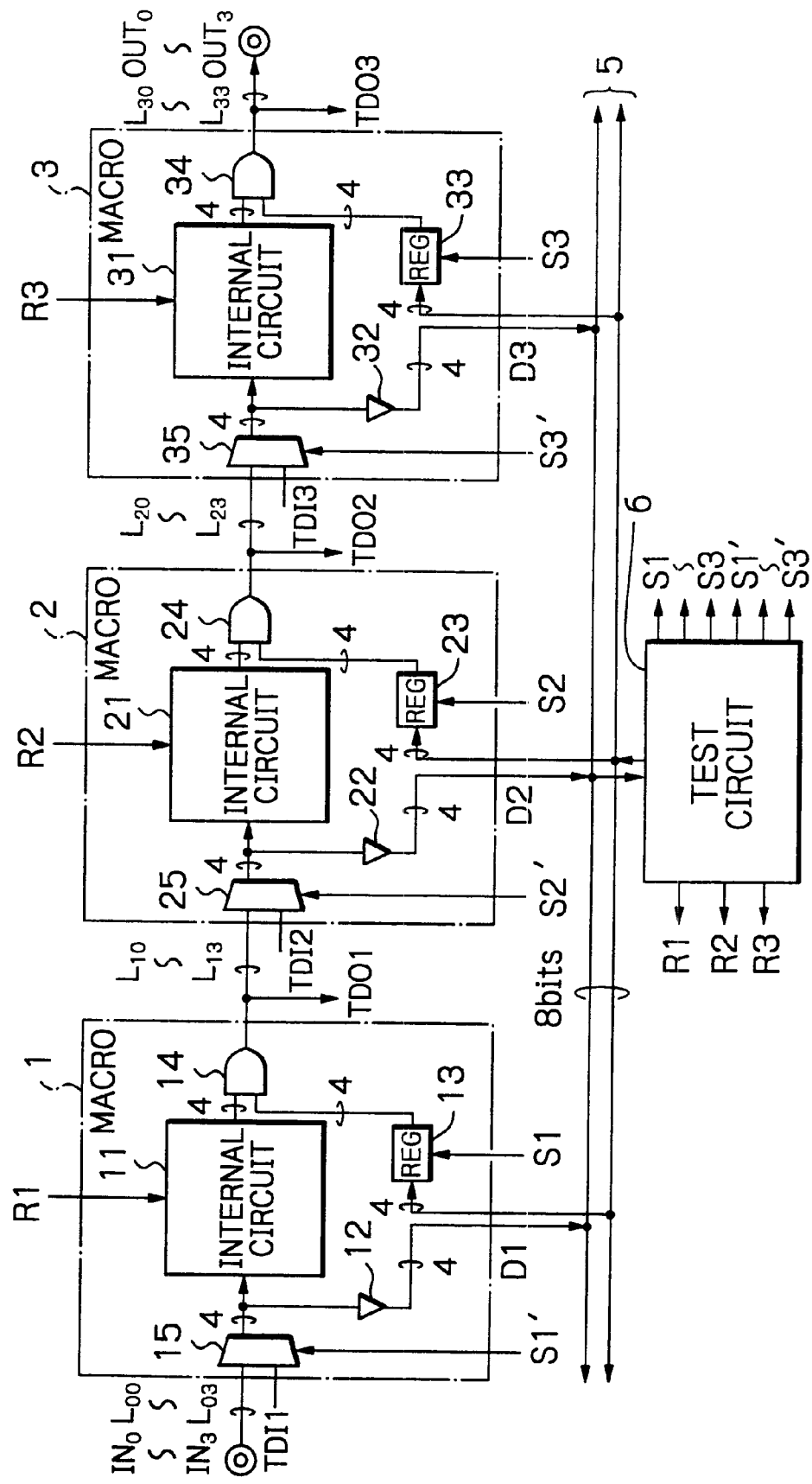
FIG. 7 is a detailed circuit diagram of the macros of FIG. 6.

In FIG. 7, which is a detailed circuit diagram of the macros 1, 2 and 3 of FIG. 6 selectors 15, 25 and 35 are added to the macros 1, 2 and 3, respectively, of FIG. 3.

When testing the connections $L_{00}$, $L_{01}$, . . . , $L_{33}$ of FIG. 7, the test circuit 6 operates in the same way as illustrated in FIGS. 4A, 4B and 4C.

When testing the function of one of the internal circuits 11, 12 and 13, the test circuit 6 generates one of the selection signals S1', S2' and S3' to control the selector 15, 25 or 35. For example, when the selection signal S1' is generated by the test circuit 6, the selector 15 selects its lower side input. In this state, the test circuit 6 generates input test data TDI1, so that the test data TDI1 is supplied from the selector 15 to the internal circuit 15. Therefore, the internal circuit 11 performs a predetermined operation upon the test data TDI1 and then, generates output test data TDO1. The output test data TDO1 is supplied to the test circuit 6, thus completing the test of the internal circuit 11.

In the above-described embodiments, although the test of the connections $L_{00}$, $L_{01}$, $L_{33}$ is carried out by the test circuit 6, it is possible for the CPU 4 to carry out such a test.

As explained hereinabove, according to the present invention, even when the number of macros as well as the number of connections thereof is increased, since an area for a boundary scan path is not required, the integration can be enhanced. Further, it is possible to completely test all the connections from the input terminals via the macros to the output terminals.

What is claimed is:

1. A semiconductor device comprising:
   a common bus;
   a first macro having an output terminal, said first macro including a first internal circuit having an output node coupled to said output terminal and a register coupled between said output terminal and said common bus, said register storing a test data supplied from said common bus;
   a second macro having an input terminal, said second macro including a second internal circuit having an input node coupled to said input terminal and a buffer coupled between said input terminal and said common bus, said buffer supplying a data of said input terminal to said common bus; and
   a connection connected between said output terminal and said input terminal.

2. The device as claimed in claim 1, further comprising a selector coupled among an input terminal of said first macro, an input node of said first internal circuit, and a test input terminal.

3. The device as claimed in claim 1, further comprising a test output terminal coupled to said output terminal.

4. A semiconductor device comprising:
   a common bus;
   a first macro having an output terminal, said first macro including a first internal circuit having an output node, a register coupled to said common bus, and a gate circuit connected among said output node, said register and said output terminal;
   a second macro having an input terminal, said second macro including a second internal circuit having an input node coupled to said input terminal and a buffer coupled to said input terminal and said common bus; and
   a connection connected between said output terminal and said input terminal.

5. The device as claimed in claim 4, further comprising a selector coupled among an input terminal of said first macro, an input node of said first internal circuit and a test input terminal.

6. The device as claimed in claim 4, further comprising a test output terminal coupled to said output terminal.

7. A semiconductor device comprising:
   a common bus;
   a first macro having an output terminal, said first macro including a first internal circuit having an output node coupled to including a first internal circuit having an output node coupled to said output terminal and a register coupled between said output terminal and said common bus;
   a second macro having an input terminal, said second macro including a second internal circuit having an input node coupled to said input terminal, a selector coupled among said input terminal, said input node, and a test input terminal, and a buffer coupled between said common bus; and
   a connection connected between said output terminal and said input terminal.

8. The device as claimed in claim 7, further comprising a selector coupled among an input terminal of said first macro, an input node of said first internal circuit, and a test input terminal.

9. The device as claimed in claim 7, further comprising a test output terminal coupled to said output terminal.

* * * * *

UNITED STATES PATENT AND TRADEMARK OFFICE
CERTIFICATE OF CORRECTION

PATENT NO.   : 6,463,562 B1
DATED        : October 8, 2002
INVENTOR(S)  : Shigekazu Otsuka It is certified that error appears in the above-identified patent and that said Letters Patent is hereby corrected as shown below:

<u>Title page,</u>
Item [30], "Apr. 6, 1999" should read -- Jun. 4, 1999 --

Signed and Sealed this

Twenty-ninth Day of July, 2003

JAMES E. ROGAN
*Director of the United States Patent and Trademark Office*